(12) United States Patent
Sekiya

(10) Patent No.: US 10,870,220 B2
(45) Date of Patent: Dec. 22, 2020

(54) CHUCK TABLE AND PROCESSING APPARATUS INCLUDING THE SAME

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/295,706

(22) Filed: Mar. 7, 2019

(65) Prior Publication Data
US 2019/0275700 A1    Sep. 12, 2019

(30) Foreign Application Priority Data

Mar. 8, 2018   (JP) ................................ 2018-041615

(51) Int. Cl.

| | |
|---|---|
| *H01L 21/683* | (2006.01) |
| *B28D 5/00* | (2006.01) |
| *G01N 29/14* | (2006.01) |
| *H01L 21/67* | (2006.01) |
| *B28D 5/02* | (2006.01) |
| *H01L 21/66* | (2006.01) |
| *H01L 21/82* | (2006.01) |
| *H01L 21/78* | (2006.01) |

(52) U.S. Cl.
CPC ......... *B28D 5/0094* (2013.01); *B28D 5/0076* (2013.01); *B28D 5/024* (2013.01); *G01N 29/14* (2013.01); *H01L 21/67092* (2013.01); *H01L 21/6838* (2013.01); *H01L 22/10* (2013.01); *H01L 21/78* (2013.01); *H01L 21/82* (2013.01); *H01L 22/12* (2013.01)

(58) Field of Classification Search
CPC .... B28D 5/0094; B28D 5/0076; B28D 5/024; H01L 21/78; H01L 22/10; H01L 21/82; H01L 21/67092; H01L 21/638; H01L 22/12; G01N 29/14; G01N 2291/2697; G01N 29/223

See application file for complete search history.

(56) References Cited

U.S. PATENT DOCUMENTS

| | | | | |
|---|---|---|---|---|
| 5,191,218 A | * | 3/1993 | Mori | ...................... G03F 7/707 |
| | | | | 250/453.11 |
| 2014/0208850 A1 | * | 7/2014 | Kim | ...................... G01N 29/14 |
| | | | | 73/587 |

FOREIGN PATENT DOCUMENTS

| | | | |
|---|---|---|---|
| JP | 06031627 A | * | 2/1994 |
| JP | 2001110754 A | | 4/2001 |

\* cited by examiner

*Primary Examiner* — Eric A. Gates
*Assistant Examiner* — Paul M Janeski
(74) *Attorney, Agent, or Firm* — Greer Burns & Crain, Ltd.

(57) ABSTRACT

A chuck table having a holding portion for holding a workpiece and a frame for supporting the holding portion. The holding portion includes a substrate having a plurality of fine holes arranged like a matrix at given intervals and a plurality of acoustic emission sensors arranged like a matrix on the substrate and spaced from each other so that each fine hole of the substrate is located between any adjacent ones of the acoustic emission sensors. The plurality of fine holes are connected through the frame to a vacuum source, thereby holding the workpiece on the acoustic emission sensors under suction. An elastic wave generated from the workpiece in processing the workpiece is collected at a plurality of positions by the plurality of acoustic emission sensors.

5 Claims, 5 Drawing Sheets

US 10,870,220 B2

CHUCK TABLE AND PROCESSING APPARATUS INCLUDING THE SAME

BACKGROUND OF THE INVENTION

Field of the Invention

The present invention relates to a chuck table having a holding portion for holding a workpiece and also to a processing apparatus including the chuck table.

Description of the Related Art

A plurality of devices such as integrated circuits (ICs) and large-scale integrated circuits (LSIs) are formed on the front side of a wafer in a plurality of separate regions defined by a plurality of crossing division lines. Such a wafer having the plural devices is divided along the division lines by a cutting apparatus to obtain a plurality of individual device chips. These device chips are used in various electrical equipment such as mobile phones and personal computers.

The cutting apparatus includes a chuck table for holding the wafer, a cutting unit having a rotatable cutting blade for cutting the wafer held on the chuck table, a pair of cutting water nozzles located on the opposite sides of the cutting blade for supplying a cutting water to the cutting blade, an X moving mechanism for relatively moving the chuck table and the cutting unit in an X direction, and a Y moving mechanism for relatively moving the chuck table and the cutting unit in a Y direction perpendicular to the X direction. With this configuration, the wafer can be cut along the division lines with high accuracy (see JP 2001-110754A, for example).

SUMMARY OF THE INVENTION

However, there is a possibility that the cutting blade may be clogged or chipped and an imbalance in supply amount of the cutting water may be caused between the pair of cutting water nozzles located on the opposite sides of the cutting blade. Such trouble may have an adverse effect on cutting accuracy. However, the trouble cannot be quantitatively detected and high-precision cutting cannot be maintained.

Further, also in any other processing apparatuses for processing the wafer held on the chuck table, such as a laser processing apparatus, a grinding apparatus, and a polishing apparatus, such trouble cannot be quantitatively detected and high-precision processing cannot be maintained.

It is therefore an object of the present invention to provide a chuck table which can quantitatively detect the above trouble. It is another object of the present invention to provide a processing apparatus including the above chuck table.

In accordance with an aspect of the present invention, there is provided a chuck table having a holding portion holding a workpiece and a frame supporting the holding portion, the holding portion including a substrate having a plurality of fine holes arranged like a matrix at given intervals and a plurality of acoustic emission sensors arranged like a matrix on the substrate and spaced from each other so that each fine hole of the substrate is located between any adjacent ones of the acoustic emission sensors. The plurality of fine holes is connected through the frame to a vacuum source, thereby holding the workpiece on the acoustic emission sensors under suction An elastic wave is generated from the workpiece in processing the workpiece and is collected at a plurality of positions by the plurality of acoustic emission sensors.

In accordance with another aspect of the present invention, there is provided a processing apparatus including a chuck table including a substrate and a plurality of acoustic emission sensors arranged like a matrix on the substrate, the substrate having a plurality of fine holes arranged like a matrix at given intervals, the acoustic emission sensors being spaced from each other so that each fine hole of the substrate is located between any adjacent ones of the acoustic emission sensors; a processing unit processing a workpiece held on the chuck table; a moving mechanism relatively moving the chuck table and the processing unit; and a display unit displaying an intensity of an elastic wave collected by the plurality of acoustic emission sensors.

Preferably, the plurality of acoustic emission sensors are arranged at X-Y coordinates, and the intensity of the elastic wave collected is displayed at X-Y coordinates on a screen of the display unit. Preferably, the intensity of the elastic wave collected is displayed in color on the screen of the display unit. Preferably, the processing apparatus further includes a recording unit recording the intensity of the elastic wave collected by the plurality of acoustic emission sensors.

Preferably, the processing unit includes a spindle adapted to be rotationally driven, a cutting unit having a cutting blade mounted on a front end of the spindle for cutting the workpiece, and a cutting water nozzle for supplying a cutting water to the cutting unit, and the moving mechanism includes an X moving mechanism for relatively moving the chuck table and the processing unit in an X direction and a Y moving mechanism for relatively moving the chuck table and the processing unit in a Y direction perpendicular to the X direction.

In the case where the chuck table of the present invention is mounted in a cutting apparatus, there is a possibility that a cutting blade may be clogged or chipped and an imbalance in supply amount of the cutting water may be caused between a pair of cutting water nozzles located on the opposite sides of the cutting blade. According to the present invention, such trouble can be quantitatively detected according to a change in the elastic wave collected by the acoustic emission sensors.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
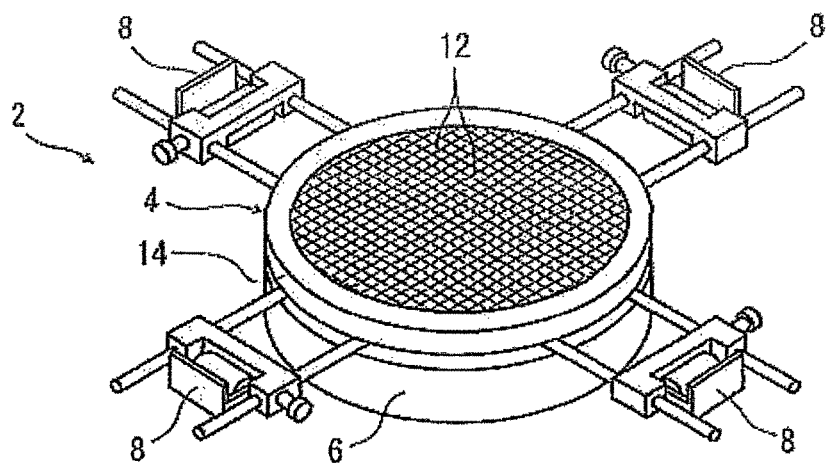
FIG. 1 is a perspective view of a chuck table according to a preferred embodiment of the present invention.
Figure 2:
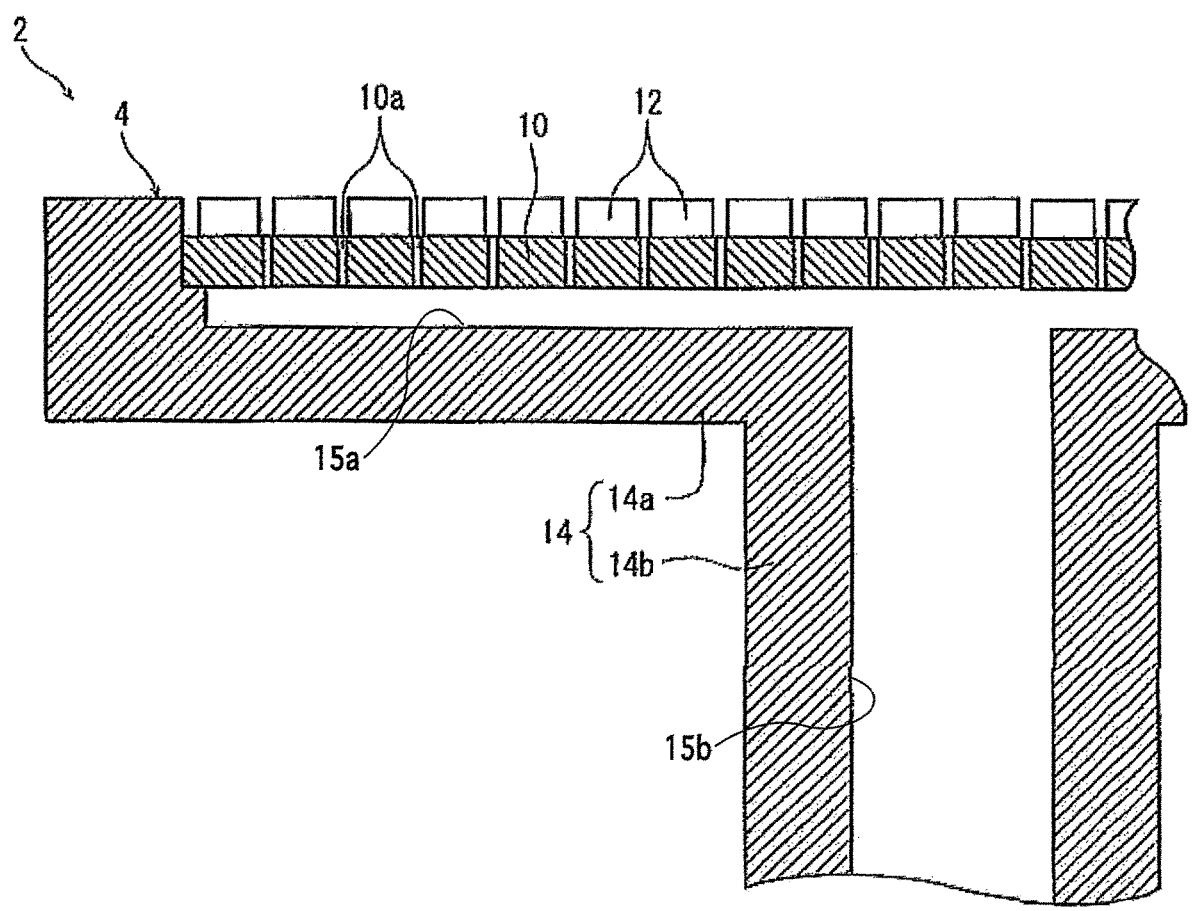
FIG. 2 is an enlarged sectional view of an essential part of a holding portion constituting the chuck table depicted in FIG. 1.

There will now be described a chuck table and a processing apparatus according to a preferred embodiment of the present invention with reference to the drawings. First, the chuck table according to this preferred embodiment will be described. FIG. 1 depicts the chuck table generally denoted by reference numeral 2. As depicted in FIG. 1, the chuck table 2 includes a holding portion 4 for holding a workpiece such as a wafer, a supporting portion 6 for supporting the holding portion 4, and a plurality of clamps 8 provided around the periphery of the holding portion 4 so as to be arranged at given intervals. The holding portion 4 is composed of a disk-shaped substrate 10 (see FIG. 2) having a plurality of fine holes 10a (see FIG. 2), a plurality of acoustic emission (AE) sensors 12 provided on the upper surface of the substrate 10, and a frame 14 for supporting the substrate 10. As depicted in FIG. 1, the AE sensors 12 are arranged like a matrix on the upper surface of the substrate 10. As depicted in FIG. 2, the AE sensors 12 are spaced from each other, and each fine hole 10a of the substrate 10 is located between any adjacent ones of the AE sensors 12. The frame 14 has a circular top portion 14a for supporting the substrate 10 and a stem portion 14b extending downward from the lower surface of the top portion 14a at its central portion. The top portion 14a has an inside space 15a, and the stem portion 14b has a suction passage 15b communicating with the inside space 15a of the top portion 14a. The suction passage 15b of the stem portion 14b is in communication with a vacuum source (not depicted). The inside space 15a of the top portion 14a is in communication with the fine holes 10a of the substrate 10.

Accordingly, by operating the vacuum source connected to the chuck table 2, a suction force is applied through the suction passage 15b of the stem portion 14b, the inside space 15a of the top portion 14a, and the fine holes 10a to the upper surface of the substrate 10, thereby holding the workpiece on the holding portion 4 under suction. The chuck table 2 having the above configuration is adapted to be mounted in a processing apparatus such as a cutting apparatus, laser processing apparatus, grinding apparatus, and polishing apparatus. In such a processing apparatus, the workpiece held on the holding portion 4 of the chuck table 2 under suction is adapted to be variously processed, e.g., cut, laser-processed, ground, or polished. During the processing of the workpiece held on the holding portion 4 of the chuck table 2, an elastic wave is generated through the workpiece, and this elastic wave is collected at plural positions by the plural AE sensors 12 provided on the substrate 10 of the holding portion 4. Accordingly, any trouble can be quantitatively detected according to a change in the elastic wave collected by the AE sensors 12, thereby maintaining high-precision processing.

Figure 3:
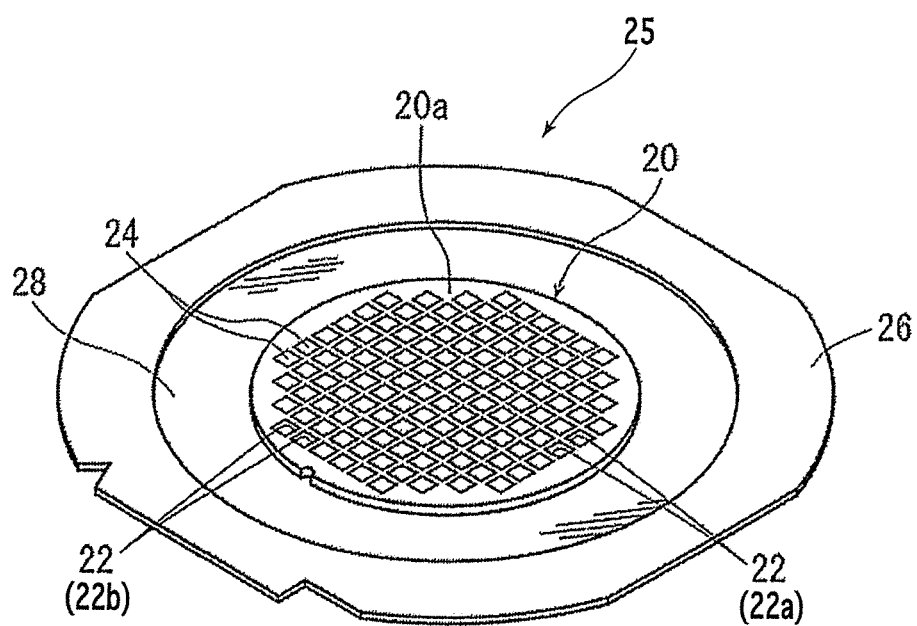
FIG. 3 is a perspective view of a wafer unit including a wafer as a workpiece.

The processing apparatus according to this preferred embodiment will now be described. FIG. 3 depicts a disk-shaped wafer 20 as a workpiece to be processed by the processing apparatus. The wafer 20 has a front side 20a, and this front side 20a is partitioned by a plurality of crossing division lines 22 to define a plurality of separate rectangular regions where a plurality of devices 24 such as ICs and LSIs are respectively formed. The plurality of division lines 22 are composed of a plurality of first division lines 22a extending in a first direction and a plurality of second division lines 22b extending in a second direction perpendicular to the first direction. In this preferred embodiment, the back side of the wafer 20 is attached to an adhesive tape 28 at its central portion. A peripheral portion of the adhesive tape 28 is fixed (attached) to an annular frame 26. Thusly, the wafer 20 is supported through the adhesive tape 28 to the annular frame 26, thereby forming a wafer unit 25.

Figure 4:
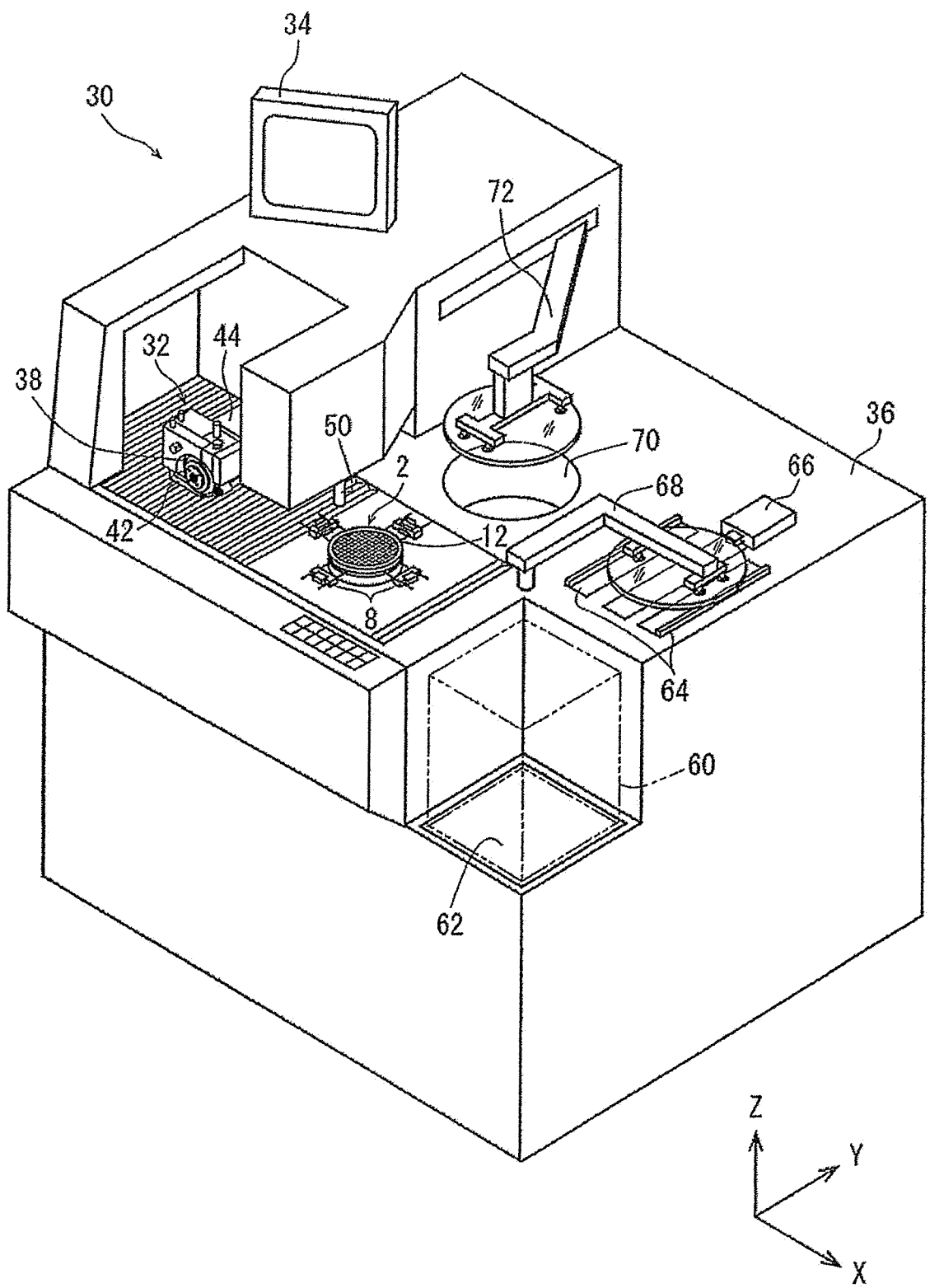
FIG. 4 is a perspective view of a processing apparatus according to the preferred embodiment of the present invention.

FIG. 4 depicts a cutting apparatus 30 as an example of the processing apparatus according to this preferred embodiment. As depicted in FIG. 4, the cutting apparatus 30 includes the chuck table 2 mentioned above, a processing unit 32 for processing the workpiece held on the chuck table 2, moving mechanism (not depicted) for relatively moving the chuck table 2 and the processing unit 32, and a display unit 34 for displaying the intensity of the elastic wave collected by the plural AE sensors 12.

The chuck table 2 is mounted on a base housing 36 so as to be movable in the X direction depicted by an arrow X in FIG. 4 and rotatable about an axis extending in the Z direction depicted by an arrow Z in FIG. 4, in which the Z direction is a vertical direction perpendicular to the X direction. In the condition where the chuck table 2 is mounted on the base housing 36, the matrix-like plural AE sensors 12 are arranged in the X direction and in the Y direction depicted by an arrow Y in FIG. 4, in which the Y direction is perpendicular to both the X direction and the Z direction. Accordingly, the plural AE sensors 12 are arranged at a plurality of X coordinates and Y coordinates, so that the positions of the plural AE sensors 12 can be specified by the X-Y coordinates. Further, the chuck table 2 is adapted to be rotated 90 degrees about the axis extending in the Z direction by a chuck table motor (not depicted) mounted in the base housing 36. Accordingly, the plural AE sensors 12 are arranged in the X direction and the Y direction both before rotation of the chuck table 2 and after rotation of the chuck table 2. The X direction and the Y direction define an X-Y plane as a substantially horizontal plane.

Figure 5:
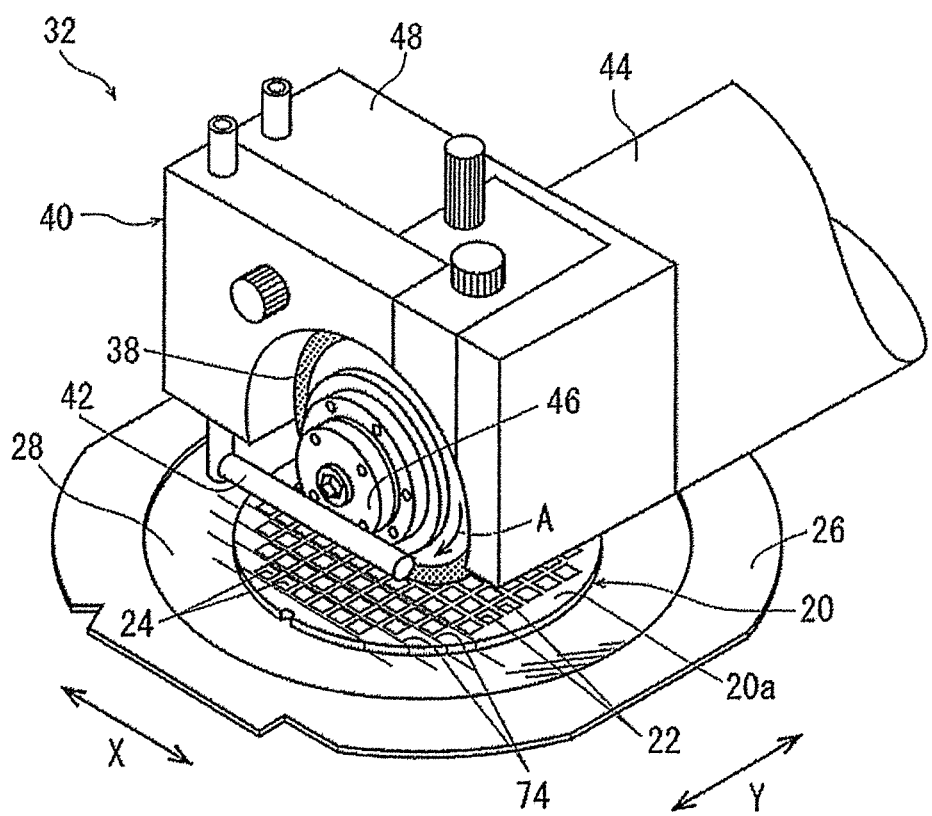
FIG. 5 is a perspective view of a processing unit included in the processing apparatus depicted in FIG. 4, depicting a condition that the wafer depicted in FIG. 3 is being processed by the processing unit.

The processing unit 32 will now be described with reference to FIGS. 4 and 5. The processing unit 32 includes a cutting unit 40 and a pair of cutting water nozzles 42 (one of which being depicted). The cutting unit 40 has a rotatable cutting blade 38 for cutting the workpiece. The cutting water nozzles 42 function to supply a cutting water to the cutting blade 38. The cutting unit 40 further includes a spindle housing 44 supported to the base housing 36 so as to be movable both in the Y direction and in the Z direction (vertical direction), a spindle 46 supported to the spindle housing 44 so as to be rotatable about an axis extending in the Y direction, a motor (not depicted) for rotating the spindle 46, and a blade cover 48 mounted on the front end of the spindle housing 44 for covering the cutting blade 38. The cutting blade 38 is fixed to the front end of the spindle 46, and the cutting water nozzles 42 are mounted on the blade cover 48. The pair of cutting water nozzles 42 are arranged on the opposite sides of the cutting blade 38 so as to extend along the side surfaces of the cutting blade 38. In FIG. 5, only one of the pair of cutting water nozzles 42 is depicted. Each cutting water nozzle 42 has a plurality of nozzle holes (not depicted) directed toward the cutting blade 38 and the workpiece. The pair of cutting water nozzles 42 are connected to a cutting water source (not depicted). Accordingly, in cutting the workpiece held on the chuck table 2 by using the cutting blade 38, the cutting water supplied from the cutting water source is sprayed from the plural nozzle holes of each cutting water nozzle 42 toward the cutting blade 38 and the workpiece.

The moving mechanism in the cutting apparatus 30 has an X moving mechanism (not depicted) for relatively moving the chuck table 2 and the processing unit 32 in the X direction and a Y moving mechanism (not depicted) for relatively moving the chuck table 2 and the processing unit 32 in the Y direction. The X moving mechanism is composed of a ball screw (not depicted) operatively connected to the chuck table 2 so as to extend in the X direction and a motor (not depicted) for rotating this ball screw. In this preferred embodiment, the chuck table 2 is moved in the X direction relative to the processing unit 32 by the X moving mechanism. Further, an imaging unit 50 for imaging the wafer 20 held on the chuck table 2 to detect a target area to be cut is provided above the path of movement of the chuck table 2. The Y moving mechanism is composed of a ball screw (not depicted) operatively connected to the spindle housing 44 of the processing unit 32 so as to extend in the Y direction and a motor (not depicted) for rotating this ball screw. In this preferred embodiment, the processing unit 32 is moved in the Y direction relative to the chuck table 2 by the Y moving mechanism. Further, the spindle housing 44 of the processing unit 32 is also movable in the Z direction by Z moving means (not depicted), which may be composed of a ball screw (not depicted) extending in the Z direction and a motor (not depicted) for rotating this ball screw.

Figure 6:
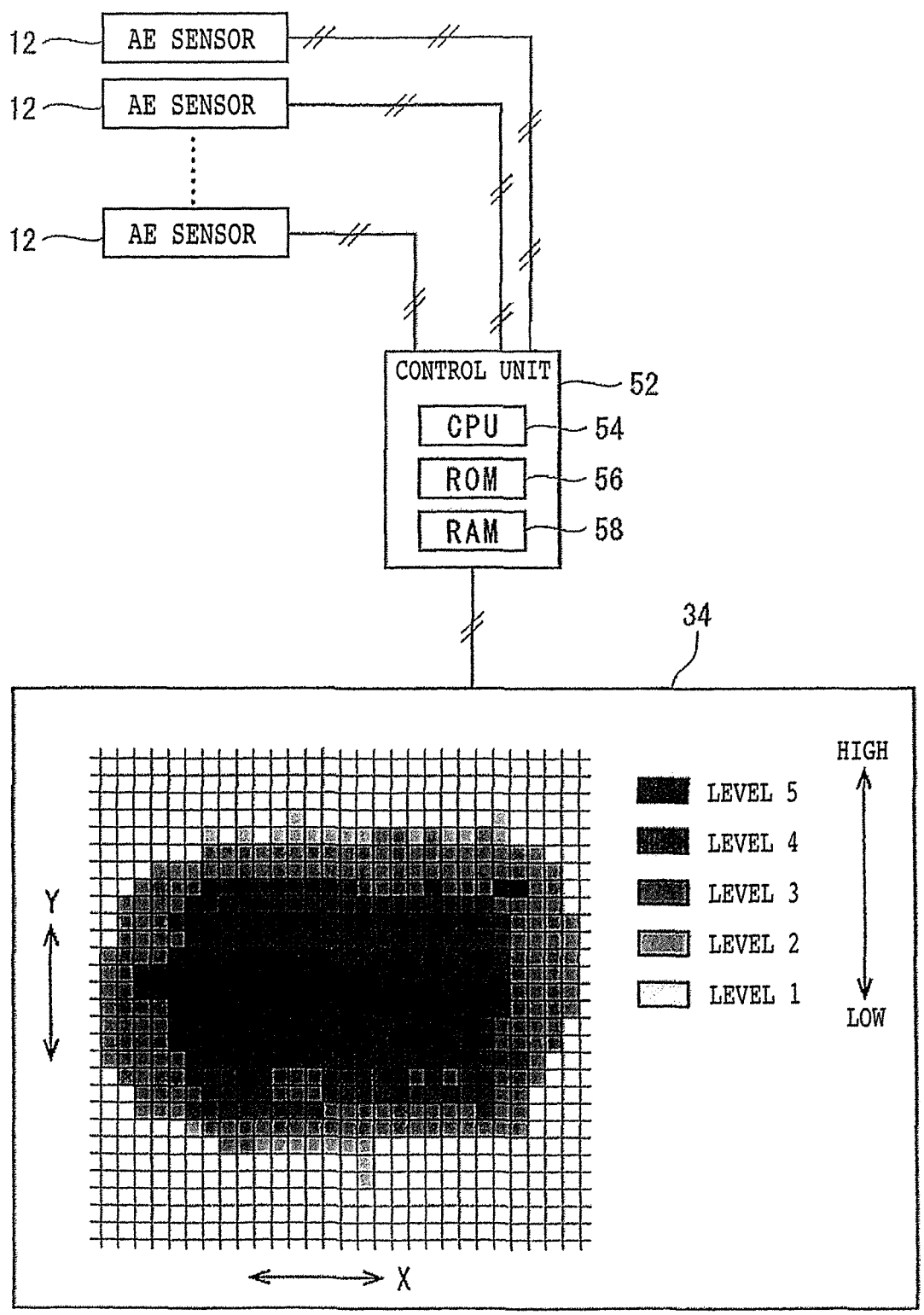
FIG. 6 is a schematic view of an image displayed on a display unit included in the processing apparatus depicted in FIG. 4, during the processing operation depicted in FIG. 5.

The display unit 34 will now be described with reference to FIGS. 4 and 6. As depicted in FIG. 4, the display unit 34 is mounted on the upper surface of the base housing 36. As depicted in FIG. 6, the display unit 34 is electrically connected through a control unit 52 to the plural AE sensors 12. The control unit 52 functions to control the operation of the cutting apparatus 30. The display unit 34 is so configured as to display the intensity of the elastic wave collected by the plural AE sensors 12 arranged at X-Y coordinates, in relation to the X-Y coordinates of the plural AE sensors 12. In the display unit 34, the horizontal axis represents the X coordinate, and the vertical axis represents the Y coordinate. Further, in this preferred embodiment, the display unit 34 is configured to display the intensity of the elastic wave at the X-Y coordinates with different depths in color. That is, as depicted in FIG. 6, the intensity of the elastic wave is classified into Level 5 to Level 1, in which Level 5 indicates the highest level and Level 1 indicates the lowest level. The higher the intensity of the elastic wave (higher in level), the deeper the color, whereas the lower the intensity of the elastic wave (lower in level), the lighter the color. As a modification, the display unit 34 may be configured to display the intensity of the elastic wave at the X-Y coordinates with different colors. For example, Level 5, Level 4, Level 3, Level 2, and Level 1 may be differently colored in red, pink, orange, yellow, and cyan, respectively. Further, the levels of the intensity of the elastic wave are not limited to five levels.

The control unit 52 is configured by a computer, which has a central processing unit (CPU) 54 for performing computation according to a control program, a read only memory (ROM) 56 previously storing the control program etc., and a random access memory (RAM) 58 for storing the result of computation etc. The RAM 58 of the control unit 52 functions as recording means (recording unit) recording the intensity of the elastic wave collected by the plural AE sensors 12.

As depicted in FIG. 4, the base housing 36 is provided with a vertically movable stage 62 for placing a cassette 60 thereon. The cassette 60 previously stores a plurality of wafer units 25, each of which is formed by supporting the wafer 20 through the adhesive tape 28 to the annular frame 26. The stage 62 is adapted to be vertically moved by an elevating mechanism (not depicted) provided in the base housing 36. The elevating mechanism may be composed of a ball screw and a motor. The cutting apparatus 30 further includes a temporary positioning table 64 for temporarily positioning the wafer 20 (the wafer unit 25), a handling unit 66 for taking the wafer 20 out of the cassette 60 to transfer it to the temporary positioning table 64 before processing and also returning the wafer 20 from the temporary positioning table 64 into the cassette 60 after processing, a first transfer unit 68 for transferring the wafer 20 from the temporary positioning table 64 to the chuck table 2 before processing, a cleaning mechanism 70 for cleaning the wafer 20 after processing, and a second transfer unit 72 for transferring the wafer 20 from the chuck table 2 to the cleaning mechanism 70.

In cutting the wafer 20 along the division lines 22 by using the cutting apparatus 30, the wafer 20 supported through the adhesive tape 28 to the annular frame 26, i.e., the wafer unit 25 is first taken out of the cassette 60 and transferred to the temporary positioning table 64 by operating the handling unit 66. Thereafter, the wafer 20 is transferred from the temporary positioning table 64 to the chuck table 2 by operating the first transfer unit 68. At this time, the wafer 20 is placed on the upper surface of the chuck table 2 in the condition where the first division lines 22a extending in the first direction become parallel to the X direction. Thereafter, the vacuum source is operated to produce a suction force on the upper surface of the chuck table 2, thereby holding the wafer 20 on the chuck table 2 under suction. Further, the annular frame 26 is fixed by the plural clamps 8. Thereafter, the wafer 20 is imaged by the imaging unit 50 located above the chuck table 2 to thereby detect the division lines 22 according to an image obtained by the imaging unit 50.

Thereafter, the X moving mechanism is operated to move the chuck table 2 in the X direction, and the Y moving mechanism is also operated to move the processing unit 32 in the Y direction, thereby positioning the cutting blade 38 directly above a predetermined one of the first division lines 22a. Thereafter, the motor for rotating the spindle 46 is operated to rotate the cutting blade 38 in the direction depicted by an arrow A in FIG. 5. Thereafter, the Z moving means is operated to lower the processing unit 32 until the cutting edge of the cutting blade 38 is forced into the predetermined first division line 22a aligned with the X direction. At the same time, the X moving mechanism is operated to move the chuck table 2 relative to the processing unit 32 in the X direction at a predetermined feed speed (e.g., 50 mm/s), thereby cutting the wafer 20 along the predetermined first division line 22a. During this cutting operation, a cutting water is sprayed from the pair of cutting water nozzles 42 toward the cutting blade 38 and the wafer 20. Thereafter, the Y moving mechanism is operated to move the processing unit 32 relative to the chuck table 2 in the Y direction by the pitch of the first division lines 22a, thereby positioning the cutting blade 38 directly above the next first division line 22a adjacent other above predetermined first division line 22a already cut above (indexing operation). Thereafter, the cutting operation and the indexing operation mentioned above are similarly performed for all the other first division lines 22a. Thus, the wafer 20 is cut along all the first division lines 22a aligned with the X direction. In FIG. 5, reference numerals 74 denote the cut grooves or kerfs formed along all the first division lines 22a of the wafer 20.

In this preferred embodiment, the elastic wave generated through the wafer 20 as a workpiece in performing the cutting operation is collected by the plural AE sensors 12. The elastic wave generated in performing the cutting operation includes an elastic wave due to cutting of the workpiece by the cutting blade 38 and an elastic wave due to spraying of the cutting water to be supplied from the pair of cutting water nozzles 42 toward the cutting blade 38 and the wafer 20. The intensity of the elastic wave collected by each AE sensor 12 is recorded into the RAM 58 of the control unit 52 in relation to the X-Y coordinates of the plural AE sensors 12 arranged like a matrix. Further, the intensity of the elastic wave recorded is displayed on the display unit 34. The screen of the display unit 34 is adapted to be scrolled in the X direction in synchronism with the movement of the chuck table 2 in the X direction, and also adapted to be scrolled in the Y direction in synchronism with the movement of the processing unit 32 in the Y direction. Accordingly, the elastic wave collected by each AE sensor 12 corresponding to the cutting position and the elastic wave collected by its adjacent AE sensors 12 are displayed on the display unit 34. There is a possibility that the cutting blade 38 may be clogged or chipped and the spraying position of each cutting water nozzle 42 may be deviated to cause an imbalance in supply amount of the cutting water between the pair of cutting water nozzles 42 located on the opposite sides of the cutting blade 38. According to this preferred embodiment, such trouble can be quantitatively detected according to a change in the elastic wave collected by the AE sensors 12.

After cutting the wafer 20 along all the first division lines 22a aligned with the X direction, the chuck table 2 is rotated 90 degrees by operating the chuck table motor to thereby align the second division lines 22b with the X direction. That is, the second division lines 22b previously aligned with the Y direction are now aligned with the X direction by the 90-degree rotation of the chuck table 2. Thereafter, the cutting operation and the indexing operation are similarly performed to cut the wafer 20 along all the second division lines 22b perpendicular to the first division lines 22a. At this time, the X-Y coordinates of the plural AE sensors 12 are changed by the 90-degree rotation of the chuck table 2. However, coordinate transformation is performed for the position of each AE sensor 12 by the CPU 54 of the control unit 52, so that the intensity of the elastic wave collected by each AE sensor 12 is displayed at the X-Y coordinates, in which the horizontal axis depicts the X coordinate and the vertical axis depicts the Y coordinate.

While the cutting apparatus 30 for cutting the workpiece held on the chuck table 2 is used as an example of the processing apparatus in the above preferred embodiment, the processing apparatus according to the present invention may be any other processing apparatuses for processing the workpiece held on the chuck table 2, such as a laser processing apparatus for performing laser processing, a grinding apparatus for performing grinding, and a polishing apparatus for performing polishing.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table having a holding portion holding a workpiece and a frame supporting the holding portion, the holding portion including:
    a substrate having a plurality of fine holes that extend vertically through the substrate and are arranged like a matrix at given intervals; and
    a plurality of acoustic emission sensors arranged like a matrix on the substrate and spaced from each other so that each fine hole of the substrate is located between any adjacent ones of the acoustic emission sensors;
    the plurality of fine holes being connected through the frame to a vacuum source, thereby holding the workpiece on the acoustic emission sensors under suction;
    wherein elastic waves are generated from processing the workpiece and collected at a plurality of positions by the plurality of acoustic emission sensors.

2. The chuck table of claim 1, further comprising a plurality of clamps provided around a periphery of the holding portion at given intervals.

3. The chuck table of claim 1, wherein the substrate is disc-shaped.

4. The chuck table of claim 1, wherein the elastic waves are generated by cutting of the workpiece and spraying of cutting water toward a cutting blade.

5. A chuck table having a holding portion holding a workpiece and a frame supporting the holding portion, the holding portion including:
    a substrate having a plurality of fine holes that extend vertically through the substrate; and
    a plurality of acoustic emission sensors arranged on an upper surface of the substrate and spaced from each other so that each fine hole of the substrate is located between any adjacent ones of the acoustic emission sensors;
    the plurality of fine holes being connected through the frame to a vacuum source, thereby holding the workpiece on the acoustic emission sensors under suction;
    wherein elastic waves are generated from processing the workpiece and collected at a plurality of positions by the plurality of acoustic emission sensors.

* * * * *